United States Patent
Nikolic et al.

[19]

[11] Patent Number: 6,081,210
[45] Date of Patent: Jun. 27, 2000

[54] SLIDING BLOCK (RATE 8/9) TRELLIS CODE FOR MAGNETIC RECORDING

[75] Inventors: Borivoje Nikolic, San Jose; Ming-Tak Leung, Sunnyvale, both of Calif.

[73] Assignee: Texas Instruments Incorporated, Dallas, Tex.

[21] Appl. No.: 09/076,717

[22] Filed: May 13, 1998

[51] Int. Cl.$^7$ .................................................. H03M 7/00
[52] U.S. Cl. ........................... 341/59; 714/794; 714/795
[58] Field of Search .............................. 341/59, 118, 120, 341/143; 714/794, 795, 761; 375/341; 360/46

[56] References Cited

U.S. PATENT DOCUMENTS

| | | | |
|---|---|---|---|
| 5,196,849 | 3/1993 | Galbraith | 341/59 |
| 5,327,440 | 7/1994 | Fredrickson et al. | 714/795 |
| 5,422,760 | 6/1995 | Abbott et al. | 360/46 |
| 5,537,112 | 7/1996 | Tsang | 341/59 |
| 5,576,707 | 11/1996 | Zook | 714/795 |
| 5,635,933 | 6/1997 | Fitzpatrick et al. | 341/58 |
| 5,691,993 | 11/1997 | Abbott et al. | 360/46 |
| 5,757,822 | 5/1998 | Fisher et al. | 341/59 |

*Primary Examiner*—Howard L. Williams
*Assistant Examiner*—Jean B. Jeanglaude
*Attorney, Agent, or Firm*—W. Daniel Swayze, Jr.; W. James Brady, III; Frederick J. Telecky, Jr.

[57] ABSTRACT

A method and system for encoding user data bits for magnetic recording channels that produces a stationary trellis and that limits the burst error propagation to three user bytes. The input data bits are grouped into even bytes and odd bytes. The even bytes are encoded first into even codewords, then each of the odd bytes is encoded into odd codewords based on the even codeword for the even byte preceding each odd byte and on the even codeword for the even byte following each odd byte. The encoding eliminates the most common error events associated with Partial Response Maximum Likelihood channels by: (i) disallowing sequences of four consecutive ones in the codewords, (ii) allowing sequences of three consecutive ones to begin only on certain bit positions in certain codewords, (iii) allowing only certain beginning sequences and ending sequences for odd and even codewords in specific situations, and (iv) changing specific bits in the odd and even codewords based on disallowed codeword sequences.

14 Claims, 8 Drawing Sheets

FIG. 3

| $y_1$-$y_4$ \ $y_9$-$y_6$ | 0000 | 0001 | 0010 | 0011 | 0100 | 0101 | 0110 | 0111 | 1000 | 1001 | 1010 | 1011 | 1100 | 1101 | 1110 | 1111 |
|---|---|---|---|---|---|---|---|---|---|---|---|---|---|---|---|---|
| 1111 | x | x | x | x | x | x | x | x | x | x | x | x | x | x | x | x |
| 1110 | x | x | x | x | x | x | x | x | x | x | x | x | x | x | x | x |
| 1101 | r | s | B | B | B | B | B | B | A | A | A | A | A | A | x | x |
| 1100 | r | s | B | B | B | B | B | B | A | A | A | A | A | A | x | x |
| 1011 | r | s | B | B | B | B | B | B | A | A | A | A | A | A | x | x |
| 1010 | r | s | B | B | B | B | B | B | A | A | A | A | A | A | x | x |
| 1001 | r | s | B | B | B | B | B | B | A | A | A | A | A | A | x | x |
| 1000 | r | s | B | B | B | B | B | B | A | A | A | A | A | A | x | x |
| 0111 | r | E | C | C | C | C | C | C | D | D | D | D | D | D | x | x |
| 0110 | r | E | C | C | C | C | C | C | D | D | D | D | D | D | x | x |
| 0101 | r | E | C | C | C | C | C | C | D | D | D | D | D | D | x | x |
| 0100 | r | E | C | C | C | C | C | C | D | D | D | D | D | D | x | x |
| 0011 | r | E | C | C | C | C | C | C | D | D | D | D | D | D | x | x |
| 0010 | r | E | C | C | C | C | C | C | D | D | D | D | D | D | x | x |
| 0001 | r | s | F | F | F | F | F | F | s | s | s | s | s | s | x | x |
| 0000 | r | r | r | r | r | r | r | r | r | r | r | r | r | r | x | x |

FIG. 4

| $y_1$-$y_4$ \ $y_9$-$y_6$ | 0000 | 0001 | 0010 | 0011 | 0100 | 0101 | 0110 | 0111 | 1000 | 1001 | 1010 | 1011 | 1100 | 1101 | 1110 | 1111 |
|---|---|---|---|---|---|---|---|---|---|---|---|---|---|---|---|---|
| 1111 | x | x | x | x | x | x | x | x | x | x | x | x | x | x | x | x |
| 1110 | x | x | x | x | x | x | x | x | x | x | x | x | x | x | x | x |
| 1101 | r | R | R | x | Q | Q | Q | x | K | K | K | x | I | I | x | x |
| 1100 | r | R | R | x | Q | Q | Q | x | K | K | K | x | I | I | x | x |
| 1011 | x | x | x | x | x | x | x | x | x | x | x | x | x | x | x | x |
| 1010 | r | S | S | x | T1 | T2 | T2 | x | L2 | L2 | L1 | x | J | J | x | x |
| 1001 | r | S | S | x | T1 | T2 | T2 | x | L2 | L2 | L1 | x | J | J | x | x |
| 1000 | r | S | S | x | T1 | T2 | T2 | x | L2 | L2 | L1 | x | J | J | x | x |
| 0111 | x | x | x | x | x | x | x | x | x | x | x | x | x | x | x | x |
| 0110 | r | U | U | x | Z2 | Z1 | Z3 | x | M2 | M2 | M1 | x | N | N | x | x |
| 0101 | r | U | U | x | Z2 | Z1 | Z3 | x | M2 | M2 | M1 | x | N | N | x | x |
| 0100 | r | U | U | x | Z2 | Z1 | Z3 | x | M2 | M2 | M1 | x | N | N | x | x |
| 0011 | x | x | x | x | x | x | x | x | x | x | x | x | x | x | x | x |
| 0010 | r | V | V | x | W | W | W | x | P | P | P | x | O | O | x | x |
| 0001 | r | V | V | x | W | W | W | x | P | P | P | x | O | O | x | x |
| 0000 | r | r | r | x | r | r | r | x | r | r | r | x | r | r | x | x |

| $d_7-d_4$ | | | | | | | | | | | | | | | | |
|---|---|---|---|---|---|---|---|---|---|---|---|---|---|---|---|---|
| 1111 | R | R | Q | Q | Q | T2 | T2 | T2 | L2 | L2 | L2 | K | K | K | I | I |
| 1110 | R | R | Q | Q | Q | T2 | T2 | T2 | L2 | L2 | L2 | K | K | K | I | I |
| 1101 | S | S | B | B | B | B | B | B | A | A | A | A | A | A | J | J |
| 1100 | S | S | B | B | B | B | B | B | A | A | A | A | A | A | J | J |
| 1011 | S | S | B | B | B | B | B | B | A | A | A | A | A | A | J | J |
| 1010 | Z1 | T1 | B | B | B | B | B | B | A | A | A | A | A | A | L1 | Z3 |
| 1001 | Z1 | T1 | B | B | B | B | B | B | A | A | A | A | A | A | L1 | Z3 |
| 1000 | Z1 | T1 | B | B | B | B | B | B | A | A | A | A | A | A | L1 | Z3 |
| 0111 | E | E | C | C | C | C | C | C | D | D | D | D | D | D | M1 | Z2 |
| 0110 | E | E | C | C | C | C | C | C | D | D | D | D | D | D | M1 | Z2 |
| 0101 | E | E | C | C | C | C | C | C | D | D | D | D | D | D | M1 | Z2 |
| 0100 | U | U | C | C | C | C | C | C | D | D | D | D | D | D | N | N |
| 0011 | U | U | C | C | C | C | C | C | D | D | D | D | D | D | N | N |
| 0010 | U | U | C | C | C | C | C | C | D | D | D | D | D | D | N | N |
| 0001 | V | V | W | W | W | F | F | F | M2 | M2 | M2 | P | P | P | O | O |
| 0000 | V | V | W | W | W | F | F | F | M2 | M2 | M2 | P | P | P | O | O |
| | 0000 | 0001 | 0010 | 0011 | 0100 | 0101 | 0110 | 0111 | 1000 | 1001 | 1010 | 1011 | 1100 | 1101 | 1110 | 1111 |

| $d_7-d_4$ | | | | | | | | | | | | | | | | |
|---|---|---|---|---|---|---|---|---|---|---|---|---|---|---|---|---|
| 1111 | I | I | K | K | K | L2 | L2 | L2 | T2 | T2 | T2 | Q | Q | Q | R | R |
| 1110 | I | I | K | K | K | L2 | L2 | L2 | T2 | T2 | T2 | Q | Q | Q | R | R |
| 1101 | J | J | A | A | A | A | A | A | B | B | B | B | B | B | S | S |
| 1100 | J | J | A | A | A | A | A | A | B | B | B | B | B | B | S | S |
| 1011 | J | J | A | A | A | A | A | A | B | B | B | B | B | B | S | S |
| 1010 | Z3 | L1 | A | A | A | A | A | A | B | B | B | B | B | B | T1 | Z1 |
| 1001 | Z3 | L1 | A | A | A | A | A | A | B | B | B | B | B | B | T1 | Z1 |
| 1000 | Z3 | L1 | A | A | A | A | A | A | B | B | B | B | B | B | T1 | Z1 |
| 0111 | Z2 | M1 | D | D | D | D | D | D | C | C | C | C | C | C | E | E |
| 0110 | Z2 | M1 | D | D | D | D | D | D | C | C | C | C | C | C | E | E |
| 0101 | Z2 | M1 | D | D | D | D | D | D | C | C | C | C | C | C | E | E |
| 0100 | N | N | D | D | D | D | D | D | C | C | C | C | C | C | U | U |
| 0011 | N | N | D | D | D | D | D | D | C | C | C | C | C | C | U | U |
| 0010 | N | N | D | D | D | D | D | D | C | C | C | C | C | C | U | U |
| 0001 | O | O | P | P | P | M2 | M2 | M2 | F | F | F | W | W | W | V | V |
| 0000 | O | O | P | P | P | M2 | M2 | M2 | F | F | F | W | W | W | V | V |
| | 0000 | 0001 | 0010 | 0011 | 0100 | 0101 | 0110 | 0111 | 1000 | 1001 | 1010 | 1011 | 1100 | 1101 | 1110 | 1111 |

| $d_7 - d_4$ \ $d_3 - d_0$ | 0000 | 0001 | 0010 | 0011 | 0100 | 0101 | 0110 | 0111 | 1000 | 1001 | 1010 | 1011 | 1100 | 1101 | 1110 | 1111 |
|---|---|---|---|---|---|---|---|---|---|---|---|---|---|---|---|---|
| 1111 | V | V | W | W | W | F | F | F | M2 | M2 | M2 | P | P | P | O | O |
| 1110 | V | V | W | W | W | F | F | F | M2 | M2 | M2 | P | P | P | O | O |
| 1101 | U | U | C | C | C | C | C | C | D | D | D | D | D | D | N | N |
| 1100 | U | U | C | C | C | C | C | C | D | D | D | D | D | D | N | N |
| 1011 | U | U | C | C | C | C | C | C | D | D | D | D | D | D | N | N |
| 1010 | E | E | C | C | C | C | C | C | D | D | D | D | D | D | M1 | Z2 |
| 1001 | E | E | C | C | C | C | C | C | D | D | D | D | D | D | M1 | Z2 |
| 1000 | E | E | C | C | C | C | C | C | D | D | D | D | D | D | M1 | Z2 |
| 0111 | Z1 | T1 | B | B | B | B | B | B | A | A | A | A | A | A | L1 | Z3 |
| 0110 | Z1 | T1 | B | B | B | B | B | B | A | A | A | A | A | A | L1 | Z3 |
| 0101 | Z1 | T1 | B | B | B | B | B | B | A | A | A | A | A | A | L1 | Z3 |
| 0100 | S | S | B | B | B | B | B | B | A | A | A | A | A | A | J | J |
| 0011 | S | S | B | B | B | B | B | B | A | A | A | A | A | A | J | J |
| 0010 | S | S | B | B | B | B | B | B | A | A | A | A | A | A | J | J |
| 0001 | R | R | Q | Q | Q | T2 | T2 | T2 | L2 | L2 | L2 | K | K | K | I | I |
| 0000 | R | R | Q | Q | Q | T2 | T2 | T2 | L2 | L2 | L2 | K | K | K | I | I |

FIG. 8

| $d_7 - d_4$ \ $d_3 - d_0$ | 0000 | 0001 | 0010 | 0011 | 0100 | 0101 | 0110 | 0111 | 1000 | 1001 | 1010 | 1011 | 1100 | 1101 | 1110 | 1111 |
|---|---|---|---|---|---|---|---|---|---|---|---|---|---|---|---|---|
| 1111 | O | O | P | P | P | M2 | M2 | M2 | F | F | F | W | W | W | V | V |
| 1110 | O | O | P | P | P | M2 | M2 | M2 | F | F | F | W | W | W | V | V |
| 1101 | N | N | D | D | D | D | D | D | C | C | C | C | C | C | U | U |
| 1100 | N | N | D | D | D | D | D | D | C | C | C | C | C | C | U | U |
| 1011 | N | N | D | D | D | D | D | D | C | C | C | C | C | C | U | U |
| 1010 | Z2 | M1 | D | D | D | D | D | D | C | C | C | C | C | C | E | E |
| 1001 | Z2 | M1 | D | D | D | D | D | D | C | C | C | C | C | C | E | E |
| 1000 | Z2 | M1 | D | D | D | D | D | D | C | C | C | C | C | C | E | E |
| 0111 | Z3 | L1 | A | A | A | A | A | A | B | B | B | B | B | B | T1 | Z1 |
| 0110 | Z3 | L1 | A | A | A | A | A | A | B | B | B | B | B | B | T1 | Z1 |
| 0101 | Z3 | L1 | A | A | A | A | A | A | B | B | B | B | B | B | T1 | Z1 |
| 0100 | J | J | A | A | A | A | A | A | B | B | B | B | B | B | S | S |
| 0011 | J | J | A | A | A | A | A | A | B | B | B | B | B | B | S | S |
| 0010 | J | J | A | A | A | A | A | A | B | B | B | B | B | B | S | S |
| 0001 | I | I | K | K | K | L2 | L2 | L2 | T2 | T2 | T2 | Q | Q | Q | R | R |
| 0000 | I | I | K | K | K | L2 | L2 | L2 | T2 | T2 | T2 | Q | Q | Q | R | R |

| $y_1$-$y_4$ \ $y_9$-$y_6$ | 0000 | 0001 | 0010 | 0011 | 0100 | 0101 | 0110 | 0111 | 1000 | 1001 | 1010 | 1011 | 1100 | 1101 | 1110 | 1111 |
|---|---|---|---|---|---|---|---|---|---|---|---|---|---|---|---|---|
| 1111 | x | x | x | x | x | x | x | x | x | x | x | x | x | x | x | x |
| 1110 | o | o | o | o | o | o | o | x | o | o | o | o | o | o | o | x |
| 1101 | o | o | o | o | o | o | o | x | o | o | o | o | o | o | o | x |
| 1100 | A | A | A | A | A | A | A | x | A | A | A | A | A | o | o | x |
| 1011 | A | A | A | A | A | A | A | x | A | A | A | v | A | o | o | x |
| 1010 | A | A | A | A | A | A | A | x | A | A | A | A | A | o | o | x |
| 1001 | A | A | A | A | A | A | A | x | A | A | A | A | A | o | o | x |
| 1000 | r | A | A | A | A | A | A | x | A | A | A | A | A | o | o | x |
| 0111 | x | x | x | x | x | x | x | x | x | x | x | x | x | x | x | x |
| 0110 | A | A | A | qc | A | A | A | x | A | A | A | A | A | o | o | x |
| 0101 | A | A | A | A | A | A | A | x | A | A | A | A | A | o | o | x |
| 0100 | A | A | A | A | A | A | A | x | A | A | A | A | A | o | o | x |
| 0011 | A | A | A | A | A | A | qc | x | A | A | A | A | A | o | o | x |
| 0010 | A | A | A | A | A | A | A | x | A | A | A | A | A | o | o | x |
| 0001 | A | A | A | A | A | A | A | x | A | A | A | A | A | o | o | x |
| 0000 | r | A | A | A | A | A | A | x | r | A | A | A | A | o | o | x |

FIG. 10

| $y_1$-$y_4$ \ $y_9$-$y_6$ | 0000 | 0001 | 0010 | 0011 | 0100 | 0101 | 0110 | 0111 | 1000 | 1001 | 1010 | 1011 | 1100 | 1101 | 1110 | 1111 |
|---|---|---|---|---|---|---|---|---|---|---|---|---|---|---|---|---|
| 1111 | x | x | x | x | x | x | x | x | x | x | x | x | x | x | x | x |
| 1110 | o | o | o | o | o | o | o | x | o | o | o | o | o | o | o | x |
| 1101 | o | x | o | x | o | x | o | x | o | x | o | x | o | x | o | x |
| 1100 | D | D | D | D | D | D | D | x | C | qc | C | R3 | C | o | o | x |
| 1011 | R1 | x | R1 | x | R1 | x | R2 | x | C | x | C | x | C | x | o | x |
| 1010 | D | D | D | D | D | D | D | x | C | R3 | C | R4 | C | o | o | x |
| 1001 | E | x | E | x | E | x | E | x | C | x | C | x | C | x | o | x |
| 1000 | D | D | D | D | D | D | D | x | C | R4 | C | R4 | C | o | o | x |
| 0111 | x | x | x | x | x | x | x | x | x | x | x | x | x | x | x | x |
| 0110 | F | F | F | F | F | F | F | x | B | G | B | G | B | o/v | o | x |
| 0101 | E | x | E | x | E | x | E | x | B | x | B | x | B | x | o | x |
| 0100 | D | D | D | D | D | D | D | x | B | G | B | G | B | o | o | x |
| 0011 | E | x | E | x | E | x | E | x | B | x | B | x | B | x | o | x |
| 0010 | D | D | D | D | D | D | D | x | B | G | B | G | B | o | o | x |
| 0001 | E | x | E | x | E | x | E | x | B | x | B | x | B | x | o | x |
| 0000 | D | D | D | D | D | D | D | x | B | G | B | G | B | o | o | x |

FIG. 11

| $d_7-d_4$ \ $d_3-d_0$ | 0000 | 0001 | 0010 | 0011 | 0100 | 0101 | 0110 | 0111 | 1000 | 1001 | 1010 | 1011 | 1100 | 1101 | 1110 | 1111 |
|---|---|---|---|---|---|---|---|---|---|---|---|---|---|---|---|---|
| 1111 | D | D | D | D | D | D | D | E | D | D | D | D | D | D | D | R4 |
| 1110 | D | D | D | D | D | D | D | E | D | D | D | D | D | D | D | R4 |
| 1101 | D | D | D | D | D | D | D | E | D | D | D | D | D | D | D | R4 |
| 1100 | A | A | A | A | A | A | A | E | A | A | A | A | C | C | C | C |
| 1011 | A | A | A | A | A | A | A | E | A | A | A | R2 | A | C | C | C |
| 1010 | A | A | A | A | A | A | A | E | A | A | A | A | C | C | C | C |
| 1001 | A | A | A | A | A | A | A | E | A | A | A | A | C | C | C | C |
| 1000 | R1 | A | A | A | A | A | A | E | A | A | A | A | C | C | C | C |
| 0111 | F | F | F | F | F | F | F | E | G | G | G | G | G | G | G | G |
| 0110 | A | A | A | R3 | A | A | A | E | A | A | A | A | B | B | B | B |
| 0101 | A | A | A | A | A | A | A | E | A | A | A | A | B | B | B | B |
| 0100 | A | A | A | A | A | A | A | E | A | A | A | A | B | B | B | B |
| 0011 | A | A | A | A | A | A | R3 | E | A | A | A | A | B | B | B | B |
| 0010 | A | A | A | A | A | A | A | E | A | A | A | A | B | B | B | B |
| 0001 | A | A | A | A | A | A | A | E | A | A | A | A | B | B | B | B |
| 0000 | R1 | A | A | A | A | A | A | E | R1 | A | A | A | B | B | B | B |

SLIDING BLOCK (RATE 8/9) TRELLIS CODE FOR MAGNETIC RECORDING

BACKGROUND OF THE INVENTION

1. Field of the Invention

The present invention relates to the field of magnetic recording channels, and more particularly, to codes for magnetic recording channels.

2. Description of the Related Art

Partial response signaling with maximum likelihood detection (PRML) has been theoretically and experimentally proven to have a substantial performance advantage over the peak detection method for magnetic storage systems.

A description of partial-response (PR) signaling principles is given by P. Kabal and S. Pasupathy, "Partial-Response Signaling," IEEE Transactions on Communications, vol. COM-23, no. 9, pp. 921–934, September 1975. In PR signaling systems, a controlled amount of intersymbol interference is allowed in the responses received by the detector.

Recently, PR has been widely applied to magnetic recording systems, replacing the peak detection method. In partial response signaling, more than one sample of the input signal has a non-zero value, as opposed to peak detection in which only one sample of the received input signal is assumed to be different than zero.

PR signaling receivers are usually combined with maximum-likelihood (ML) sequence detection methods to take advantage of the controlled amount of intersymbol interference from ML methods. The asymptotically optimal method of implementing the ML detection technique is by the use of the Viterbi algorithm described in: A. J. Viterbi, "Error Bounds for Convolutional Codes and an Asymptotically Optimum Decoding Algorithm," *IEEE Transactions on Information Theory*, Vol. IT-13, No. 2, pp. 260–269, April 1967, and G. D. Forney, Jr, "The Viterbi Algorithm," *Proceedings of the IEEE*, Vol. 61, No. 3, pp. 268–278, March 1973.

Applying the principles of PRML signaling and detection in communication channels and storage systems has been described in: G. D. Forney, Jr, "Maximum-Likelihood Sequence Estimation of Digital Sequences in the Presence of Intersymbol Interference," *IEEE Transactions on Information Theory*, Vol. IT-18, No. 3, May 1972; H. Kobayashi, "Application of Probabilistic Decoding to Digital Magnetic Recording," *IBM Journal of Research and Development*, vol. 15, pp. 64–74, January 1971; and K. Nishimura and K. Ishii, "A Design Method for Optimal Equalization in Magnetic Recording Channels with Partial Response Channel Coding," *IEEE Transactions on Magnetics*, vol. MAG- 19, pp. 1719–1721, September 1983.

PRML read channels have been used to replace peak detection channels due to their increased linear density. PRML systems equalize the received signal to the target waveform, which describes the class of the system. The commonly used channels are represented as $(1-D)(1+D)^n$, where n=1 corresponds to a class-4 (PR4) channel, n=2 corresponds to an extended PR4 (EPR4) channel, and n=3 corresponds to an $E^2PR4$ channel. D denotes a unit sample delay.

The equalized sequence is sent to a Viterbi detector which estimates the channel input sequence based on the set of noisy observations which are a set of recorded sequences possibly altered due to noise. The detector takes this set of possible input sequences and calculates which one has the highest probability of being the correct one.

Recently, several codes have been proposed for partial response signaling that by coding constraints eliminate the most common error events. It was shown in R. Karabed and N. Nazari, "Analysis of Error Sequences for PRML and EPRML Signaling Performed over Lorenzian Channel," pp. 368–373, Globecom '96, that at high user densities of the recording, the most common errors are produced by the failure to detect a sequence of three or more transitions. Maximum transition run (MTR) codes, proposed by J. Moon and B. Brickner, "Maximum Transition Run Codes for Data Storage Systems," *IEEE Transactions on Magnetics*, vol. 32, no. 5, September 1996, eliminate all the possible sequences of three or more transitions, thus resulting in reduced code density (rate 8/10). The other codes, such as Z. Keirn et al, "Experimental Performance Comparison of FTDS/DFE Detectors: 8/9 (0,k) vs. 4/5 MTR Codes," InterMag 97, allow sequences of three transitions (tribits) at specific locations within each codeword, such as at the start on either odd or even numbered bits, but not both.

The code proposed by W. Bliss, "An 8/9 Rate Time-Varying Trellis Code for High Density Magnetic Recording," InterMag 97, allow tribits at different positions within a codeword, which result in a mapping of 16 user bits to 18 bits of coded channel data. The burst error propagation of this code is 4 bytes.

The code introduced by P. H. Siegel, E. Soljanin, A. Young, "Rate 8/9 Trellis Code for E2PR4," University of at San Diego—Center for Magnetic Recording Research Seminar, May 1997, implements 8/9 code that independently maps 8 input bits into 9 code bits with the similar constraints. This code limits the propagation of error to two user bytes. The major disadvantage of this code is that its restriction on allowed tribits requires an implementation of the Viterbi detector that is variable in time, significantly increasing the detector's complexity and reducing its speed.

SUMMARY OF THE INVENTION

Accordingly, the present invention is directed to a sliding block trellis code with stationary detector for magnetic recording that substantially obviates one or more of the problems arising from the limitations and disadvantages of the related art.

The object and purpose of the present invention is to provide a trellis code for magnetic recording channels that eliminates most frequent errors while keeping the code trellis invariant in time.

Another object and purpose of the present invention is to provide a trellis code for magnetic recording channels that limits the burst error propagation to three user bytes.

It is a further object and purpose of the present invention to provide a trellis code for magnetic recording channels that decreases the detector's complexity.

It is also the object and purpose of the present invention to provide a trellis code for magnetic recording channels that increases the detector's speed.

To achieve these and other advantages, and in accordance with the purposes of the invention, as embodied and broadly described, the invention is a method and system for encoding user data bits for magnetic recording channels where the input data bits are grouped into even bytes and odd bytes. The even bytes are encoded first into even codewords. Each of the odd bytes is encoded into odd codewords based on the even codeword for the even byte preceding each odd byte and based on the even codeword for the even byte following each odd byte. The encoding eliminates the most common error events associated with Partial Response Maximum Likelihood channels.

Additional features and advantages of the invention will be set forth in the description as follows, and in part will be apparent from the description or may be learned by practice of the invention. The objectives and other advantages of the invention will be realized and attained by the methods and apparatus particularly pointed out in the written description and claims hereof together with the appended drawings.

It is to be understood that both the foregoing general description and the following detailed description are exemplary and explanatory, and are intended to provide further explanation of the invention as claimed.

The accompanying drawings are included to provide a further understanding of the invention and are incorporated in and constitute a part of this specification, illustrating two embodiments of the invention. The drawings, together with the description, serve to explain the principles of the invention.

BRIEF DESCRIPTION OF THE DRAWINGS

The present invention is illustrated by way of example, and not by way of limitation, by the Figures of the accompanying drawings in which like reference numerals refer to similar elements, and in which:

FIG. 3 is a table showing a partitioning of the codewords for odd bytes according to the present invention with bit 5 of the codeword=0.

FIG. 4 is a table showing a partitioning of the codewords for odd bytes according to the present invention with bit 5 of the codeword=1.

FIG. 5 is a table showing a mapping of the user data bits from odd bytes into the odd codeword partitions for encoder 0.

FIG. 6 is a table showing a mapping of the user data bits from odd bytes into the odd codeword partitions for encoder 1.

FIG. 7 is a table showing a mapping of the user data bits from odd bytes into the odd codeword partitions for encoder 2.

FIG. 8 is a table showing a mapping of the user data bits from odd bytes into the odd codeword partitions for encoder 3.

FIG. 10 is a table showing a partitioning of the codewords for even bytes according to the present invention with bit 5 of the codeword=0.

FIG. 11 is a table showing a partitioning of the codewords for even bytes according to the present invention with bit 5 of the codeword=1.

DETAILED DESCRIPTION OF THE INVENTION

Reference will now be made in detail to the present preferred embodiment of the invention, an example of which is illustrated in the accompanying drawings.

Code Properties

The input data bits are separated into two 8-bit groups (bytes). These two groups form odd and even bytes. The first eight-bit group received would form the first odd byte, with the next eight-bit group received forming the first even byte. Subsequent eight-bit groups received would form odd and even bytes alternating thereafter. The odd and even bytes are encoded separately. In order to increase the minimum error distance of the code, sequences of four consecutive ones are not allowed in the codewords. Sequences of three consecutive ones are allowed in the codewords on even bit positions.

Figure 1:
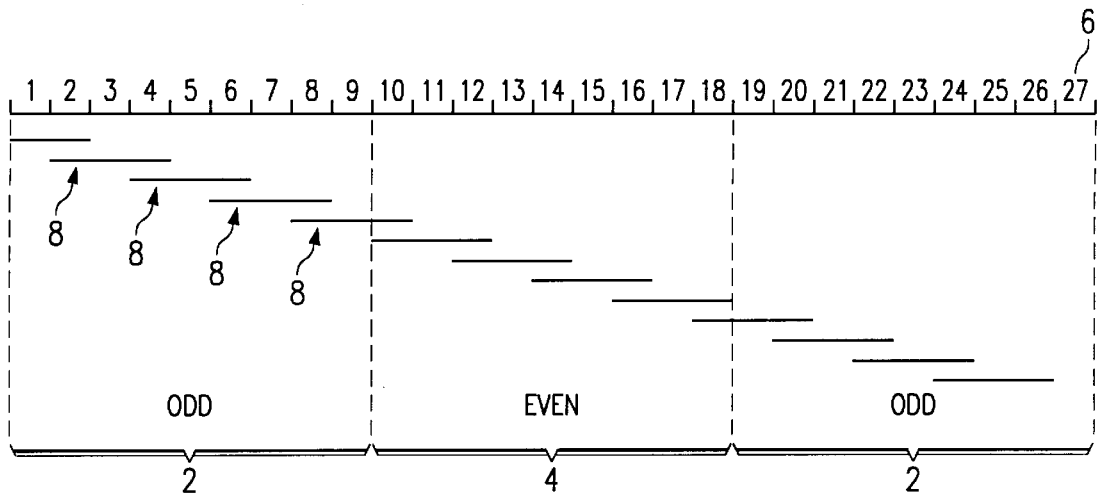
FIG. 1 shows allowed sequences of three consecutive ones in the code according to the present invention.

FIG. 1 shows three consecutive codewords of nine bits each. The odd codewords labeled with reference character 2 (ODD) are a result of encoding eight input data bits of an odd byte. Similarly, the even codewords labeled with reference character 4 (EVEN) are a result of encoding eight input data bits of an even byte. The top row 6 displays the numbers 1 through 27 representing the bit positions of the received stream of input data bits with bit 1 being the first received. The horizontal lines 8, in each byte, begin on even bit positions and represent the positions where three consecutive ones are allowed.

The 16/18 block code could be constructed by allowing the tribits at positions 2, 4, 6, 8, 10, 12, 14, 16 18. These constraints allow more than 65,536 codewords. However, since the input data is taken as two-byte groups, the burst error propagation is 4 bytes. If the bytes are encoded separately, the tribit starting at position 10 (beginning of the even codeword) and at position 16 (end of even codeword) could not be allowed because groups of 4 or 5 consecutive ones may occur at byte boundaries shown in FIG. 1. Under these constraints, the number of available codewords in the first 9-bit group is 317. Further, there are only 217 available codewords in the second. These available codewords are what remain after taking the maximum total available, $2^9=512$, and eliminating those that are not allowed by the previously recited coding constraint. This allows the mapping of 16 user bits to 18 channel bits, but doesn't allow separate mapping of two user bytes to two sequences of 9 channel bits (since 217 is less than $2^8=256$ possible user words).

The code according to the present invention increases the number of available codewords (in the even group from 217) by introducing the correlation between the odd and the even codewords. First, the set of allowed even codewords, that initially restricted the occurrence of tribits at positions 1 and 7, and dibits at positions 1 and 8, are extended to allow some dibits:

| | |
|---|---|
| 1100x - added | x0011 - added |
| 1101x - not allowed | x1011 - not allowed |
| 1110x - not allowed | x0111 - not allowed |
| 1111x - not allowed | x1111 - not allowed |

Non-allowed tribits are detected at the boundaries. These non-allowed tribits, starting at positions 9 in odd codewords and 8 in even codewords, are then re-mapped to positions 1 and 7 in even codewords. This changes the even codewords starting with 1100x to 1110x, and the even codewords ending with x0011 to x0111. This is done by careful counting of the possible codewords, and by the construction of the encoder/decoder. There exist 263 even codewords that satisfy these conditions.

The code according to the present invention eliminates the most common errors by applying the following rules:

(I) No sequence of four consecutive ones is allowed, (II) Sequences of three consecutive ones can begin only on even bit positions in odd codewords (i.e. $2^{nd}$, $4^{th}$, $6^{th}$, $8^{th}$), or on bit positions 3 or 5 in even codewords. In addition, after applying rule (IV) tribits at positions 1 and 7 in even codewords may occur.

(III) The even byte encoder is constructed in such a way that it allows sequences starting with 1100x, but eliminates sequences starting with 1101x, 1110x (rule (II)), 1111x (rule (I)). It also allows sequences ending with x0011, but eliminates sequences ending with x1011, x0111 (rule (II)), x1111 (rule (I)).

(IV) In cases where an odd codeword ends with x1, the even codeword cannot start with 11x. Or, in other words, if the even codeword is encoded first, and if it starts with 1x, the previous odd codeword cannot end with xx1 (last bit has to be 0). Symmetrically, if an even codeword ends with x11, the following odd codeword has to start with 0x.

(V) When an even codeword starts with 11x and an odd codeword ends with x1, bit 9 in the odd codeword is changed from 1 to 0, and bit 3 in the even codeword is changed from 0 to 1. When an even codeword ends with x11 and an odd codeword starts with 1x, bit 1 of the odd codeword is changed from 1 to 0 and bit 7 in the even codeword is changed from 0 to 1. Bits 3 and 7 will never already be a 1, because codewords starting with 111x or ending with x111 are not allowed (rules (II) and (III)).

The code according to the present invention requires different encoders for odd and even codewords. This separate mapping limits any burst error propagation to 3 bytes. The encoding of the even bytes is done independently, while the encoding of the odd bytes depends on the encoding of the previous and the following even bytes.

Under this encoding scheme, the incoming even bytes are encoded first. Depending on the result from encoding the even bytes, a codeword for the neighboring odd bytes will be selected from one of the four possible encoders. If the previous even codeword ends with the pattern ". . . xxx11" the first bit of the odd codeword will be forced to 0, producing the codeword "0xxxxxxxx". If the next codeword starts with "11xxxxxxx", the last bit of the odd codeword will be forced to 0 as described in rule (IV). There are enough codewords for encoding of this type, since among a total of 317 codewords, there exists:

| | |
|---|---|
| 0xxxxxxx0 | 100 words |
| 0xxxxxxx1 | 78 words |
| 1xxxxxxx0 | 78 words |
| 1xxxxxxx1 | 61 words |

Information telling which odd byte encoder was used is stored in the even codewords by using redundancy in the code. If the starting bit of the odd codeword is forced to 0, then the information will be stored in bit 7 of the previous even codeword, resulting in the same byte being mapped in codewords xxxxx011 and xxxxx111. Also, the change in the last bit will be stored in the following even codeword by changing bit 3 of the even codeword from 0 to 1. The encoders will have the same codewords, but they will differ in the way that at least one of them, every input byte, has the pattern needed: 0xxxxxxx0, 0xxxxxxx1, or 1xxxxxxx0. By allowing this redundancy, there exists 263 codewords that satisfy constraints for the even bytes.

Figure 2:
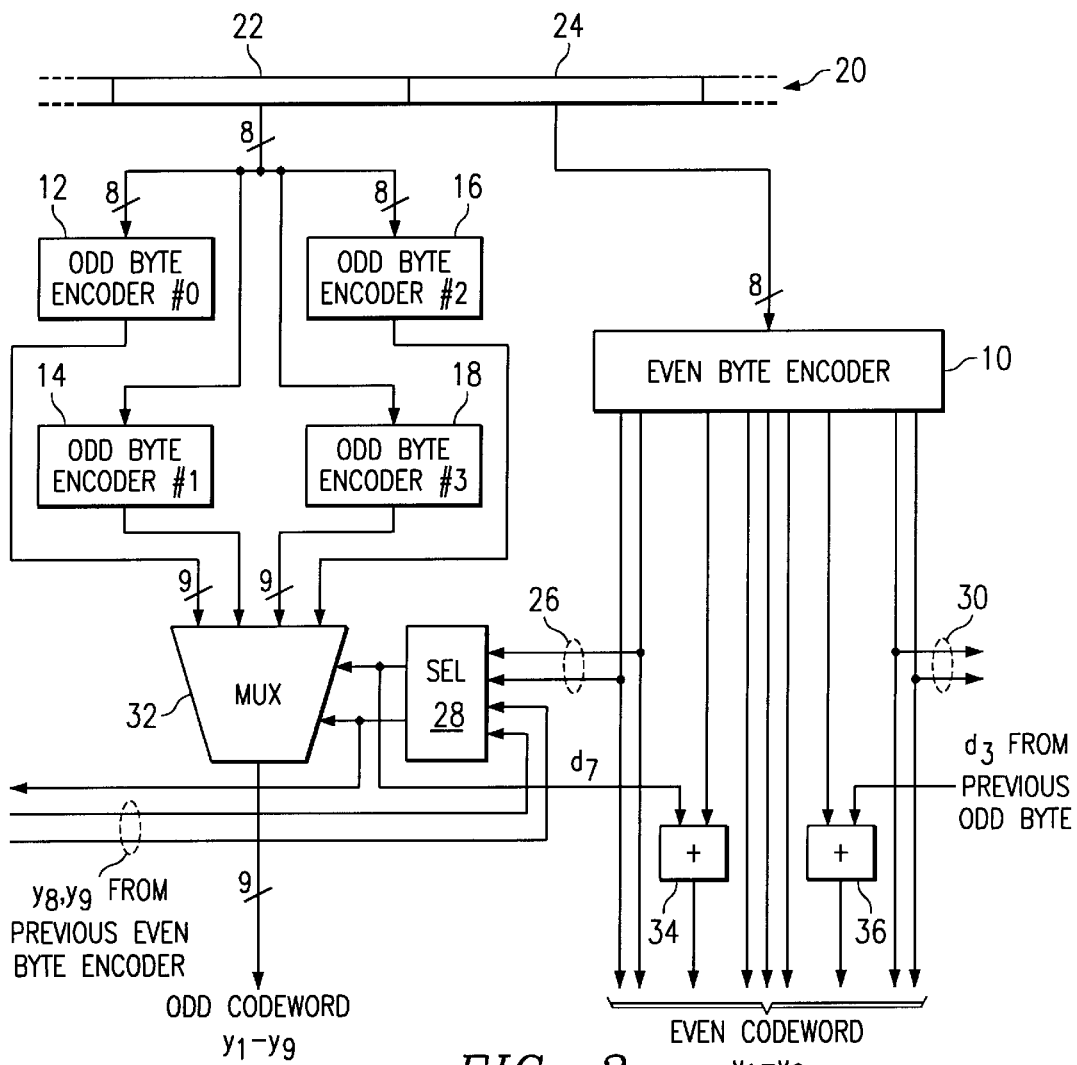
FIG. 2 shows a diagram of an encoder according to the present invention.

FIG. 2 is a block diagram that depicts odd and even encoders according to an embodiment of the present invention. In FIG. 2, a stream of user data bits 20, containing odd bytes 22 and even bytes 24, is directed to odd byte encoders 12, 14, 16 and 18, and even byte encoder 10. Output from odd byte encoders 12, 14, 16 and 18 is directed to multiplexer 32. The output from even byte decoder 10 is comprised of nine bits $y_1$ through $y_9$. Even byte encoder outputs bits $y_1$ through $y_9$ are coupled to OR gates 34 and 36, respectively. Even codeword bits $y_1$ and $Y_2$ (shown as 26) from the current even codeword, and even codeword bits $Y_8$ and $y_9$ (shown as 30) from the previous even codeword, are coupled to the inputs of select logic 28. Outputs (NUMBER1) and (NUMBER2) from select logic 28 are used to control the selection of a particular odd codeword from multiplexer 32. Outputs (NUMBER1) and (NUMBER2) from select logic 28 are also coupled to OR gates 34 and 36, respectively, and are used to record in even codeword bits $y_3$ and $y_7$ which of the four odd byte encoders 12, 14, 16 or 18 was used to supply the odd codeword passed by multiplexer 32. The even codeword thus includes $y_1$, $y_2$, $y_4$, $y_5$, $y_6$, $y_8$ and $y_9$ from even byte encoder 10, $y_3$ from OR gate 34, and $y_7$ from OR gate 36. This limitation practically eliminates tribits at positions 10 and 16 in the initial encoder design.

The subset of desired codewords is selected from all possible codewords by the following criteria: (i) limiting quasi-catastrophic behavior of the code by eliminating the 3 quasi-catastrophic sequences in the set of even codewords; (ii) eliminating 3 codewords from the set of even codewords to limit the maximum zero runlength for the even codewords to 7; (iii) codewords are eliminated to limit the runlength of the even codewords to 3; and (iv) eliminating one codeword from the even codewords such that infinitely long sequences of channel samples with only (+1, 0,–1) values for EEPR4 equalization are avoided. The total maximum zero runlength of the code is 10.

Regarding criterion (i), quasi-catastrophic sequences will be eliminated by the code such that there will not be infinitely long open error events in the partial response channel. This criteria also limits the length of the survival register required in the Viterbi detector. Criteria (ii) and (iii) limit the maximum zero runlength of the code which is essential for the robust functioning of both the timing recovery PLL (phase-locked loop) and the VGA loop. Long sequences of zeros in the codeword mean that there is no transition in the magnetization in the storage media. Without transitions in the media, there will be a lack of information for the PLL to maintain being both frequency and phase-locked to the data to generate the correct sampling instant for the channel response. Similarly, a lack of transitions in the media will produce no information for the gain control loop of the VGA to update the required amplification gain to produce constant level signals.

The elimination of the one codeword regarding criterion (iv) is to tailor or to enhance the robustness of the code for EEPR4 channels. EEPR4 channel has equalization levels of +3, +2, +1, 0, –1, –2, –3. Criterion (iv) eliminates a continuous stream of 011011011 in the coded data, as a recording sequence of 011011011 results in a response that contains only –1, 0, +1 samples. Channel responses with only +1, 0, –1 samples will only occupy a limited region of the whole signal dynamic range, resulting in a significantly reduced SNR (Signal to Noise Ratio) and thus a poorer BER (bit error rate) compared to a signal with full +3, –3 swing.

Encoder Implementation

The allowed codewords according to this embodiment of the present invention are shown in FIGS. 3 and 4 for odd codewords, and in FIGS. 10 and 11 for even codewords. The first column and last row of FIGS. 3, 4, 10, and 11 display the output codeword bits. The output codeword bits of the write channel are labeled as $y_1$ to $y_9$, where bit $y_1$ is the first bit that enters the channel (first recorded). Disallowed codewords are shaded and marked as:

x—not allowed tribits and longer sequences,
o—used for storing the information about which odd encoder is used,
s—eliminated to achieve symmetry in the code,
r—eliminated to limit the zero runlength,
qc—eliminated to limit the quasi-catastrophic behavior,
v—eliminated to limit the sequences that distract variable-gain amplifier.

Partitioning of Codewords

Allowed codewords are grouped into partitions that are labeled as A, B, C, D, E, etc. To form this mapping, the symmetry between the codewords is used. The symmetry in the odd byte encoder allows these manipulations. The symmetry is indicated by marking of the four different quadrants in FIGS. 3, 4, 10, and 11, that distinguish codewords beginning with 0 or 1 and ending with 0 or 1. There are many different ways to map the user data into codewords by using different partitioning. The partitions presented in FIGS. 3, 4, 10, and 12 are some of many solutions to implement the present invention, and is not intended to limit the scope or spirit of this invention. The partitioning also makes the equations used for implementation of the encoder and decoder easier to understand and modify should codewords be remapped.

Partitioning of User Data and Codewords

FIGS. 5, 6, 7, and 8 show how the odd byte input data bits are mapped to the odd codeword partitioning shown in FIGS. 3 and 4. FIGS. 5, 6, 7, and 8 can be used to help identify which odd byte input data bits affect which partition of odd codewords. The first column and last row of FIGS. 5, 6, 7, and 8 display the user data bits. The user data bits are labeled as d7, d6, d5, d4, d3, d2, d1, d0, where d7 is the most significant bit (msb) and d0 is the least significant bit (1sb).

Rules (IV) and (V) of the encoding scheme are implemented in the present embodiment in a way that if an even codeword starts with 11, and the previous odd codeword ends with 1, the user bits are mapped differently by using the multiplexer 32 in FIG. 2. This is also true if an even codeword ends with 11, and the next odd codeword starts with 1. The different mapping is controlled by the select logic 28 using output codeword bits $y_8$ and $y_9$ from the previous even codeword and $y_1$ and $y_2$ from the subsequent even codeword to control the multiplexer 32. The multiplexer 32 selects one of the four odd encoder output codewords based on the controls from the select logic 28. If an odd user byte starts with 1 and has to be changed to 0, odd byte encoder 14 is selected where user data bits d3, d2, d1, and d0 are inverted, resulting in a mapping as shown in FIG. 6. If an odd user byte starts with 1, and has to be changed to a 0, odd byte encoder 16 is selected where user data bits d7, d6, d5, and d4 are inverted, resulting in a mapping as shown in FIG. 7. If both the starting and ending bits have to be changed, odd byte encoder 18 is selected where a mapping results as that shown in FIG. 8. Information about the change, and which odd encoder was used, is stored in bits $y_3$ and $y_7$ of the even codeword.

Odd Encoder Design Equations

The encoding for the odd codewords according to this embodiment of the present invention is implemented by the following Boolean equations. The equations are in terms of the partitioning defined in FIGS. 3 and 4. Except for the final equations that define the output codeword bits, the equations are intermediate equations that are used in and help simplify the equations for the output codeword bits. By creating the equations using the partitioning building block approach, if codewords are remapped, it is easier to identify which equations need to be modified to make the encoder design represent the addition or deletion of codewords. One would only have to identify the partition that the addition or deletion is in, then modify that equation. All other equations that use this intermediate partition equation would remain unchanged. The final equations for the output codeword bits are used to design the encoder.

The following equations are for one possible design of encoder 12 (#0) based on the allowed codes and partitioning in FIG. 5. The mapping of the user data bits to the output codeword bits is shown under some equations. Variable CENTER covers the variables A, B, C and D in the center of FIG. 5.

$$\text{CENTER} = \overline{\text{LEFT} + \text{RIGHT} + \text{TOP} + \text{BOTTOM}} \quad (1)$$
$$[d_7 - d_0] = [d_7 d_6 d_5 d_4 d_3 d_2 d_1 d_0] \rightarrow [y_1 y_2 y_3 y_4 0 y_6 y_7 y_8 y_9]$$

$$\text{LEFT} = \overline{d_3 + d_2 + d_1} \quad (2)$$

$$\text{BOTTOM} = \overline{d_7 + d_6 + d_5} \quad (3)$$

$$\text{RIGHT} = d_3 d_2 d_1 \quad (4)$$

$$\text{TOP} = d_7 d_6 d_5 \quad (5)$$

$$V = \text{LEFT} \cdot \text{BOTTOM} \quad (6)$$
$$[d_7 - d_0] = [000 d_4 000 d_0] \rightarrow [y_1 - y_9] = [00 d_4 \overline{d_4} 1 d_0 \overline{d_0} 00]$$

$$R = \text{LEFT} \cdot \text{TOP} \quad (7)$$
$$[d_7 - d_0] = [111 d_4 000 d_0] \rightarrow [y_1 - y_9] = [110 d_4 1 d_0 \overline{d_0} 00]$$

$$I = \text{RIGHT} \cdot \text{TOP} \quad (8)$$
$$[d_7 - d_0] = [111 d_4 111 d_0] \rightarrow [y_1 - y_9] = [110 d_4 1 d_0 011]$$

$$O = \text{RIGHT} \cdot \text{BOTTOM} \quad (9)$$
$$[d_7 - d_0] = [000 d_4 111 d_0] \rightarrow [y_1 - y_9] = [00 d_4 \overline{d_4} 1 d_0 011]$$

$$EM1Z2 = \overline{d_7} d_6 (d_5 + d_4) \quad (10)$$

$$E = \text{LEFT} \cdot EM1Z2 \quad (11)$$
$$[d_7 - d_0] = [01 d_5 d_4 000 d_0] \rightarrow [y_1 - y_9] = [0 d_5 d_4 d_0 01000]$$

$$M1 = \text{RIGHT} \cdot EM1Z2 \cdot \overline{d_0} \quad (12)$$
$$[d_7 - d_0] = [01 d_5 d_4 1110] \rightarrow [y_1 - y_9] = [01 \overline{d_5 d_4} 10101]$$

$$Z2 = \text{RIGHT} \cdot EM1Z2 \cdot d_0 \quad (13)$$
$$[d_7 - d_0] = [01 d_5 d_4 1111] \rightarrow [y_1 - y_9] = [01 \overline{d_5 d_4} 10010]$$

$$UN = \overline{d_7}(\overline{d_6} d_5 + d_6 \overline{d_5 d_4}) \quad (14)$$

$$U = UN \cdot \text{LEFT} \quad (15)$$
$$[d_7 - d_0] = [0 d_6 \overline{d_6} d_4 000 d_0] \rightarrow [y_1 - y_9] = [01 d_6 d_4 1 \overline{d_0} d_0 00]$$

$$N = UN \cdot \text{RIGHT} \quad (16)$$
$$[d_7 - d_0] = [0 d_6 \overline{d_6} d_4 111 d_0] \rightarrow [y_1 - y_9] = [01 d_6 d_4 1 d_0 011]$$

$$Z1T1L1Z3 = d_7 \overline{d_6 d_5 d_4} \quad (17)$$

$$Z1 = Z1T1L1Z3 \cdot \text{LEFT} \cdot \overline{d_0} \quad (18)$$
$$[d_7 - d_0] = [10 d_5 d_4 0000] \rightarrow [y_1 - y_9] = [01 d_5 d_4 11010]$$

$$T1 = Z1T1L1Z3 \cdot \text{LEFT} \cdot d_0 \quad (19)$$
$$[d_7 - d_0] = [10 d_5 d_4 0001] \rightarrow [y_1 - y_9] = [10 d_5 d_4 10010]$$

$$L1 = Z1T1L1Z3 \cdot \text{RIGHT} \cdot \overline{d_0} \quad (20)$$
$$[d_7 - d_0] = [10 d_5 d_4 1110] \rightarrow [y_1 - y_9] = [10 d_5 d_4 10101]$$

-continued $$Z3 = Z1T1L1Z3 \cdot \text{RIGHT} \cdot d_0 \quad (21)$$
$$[d_7 - d_0] = [10d_5d_41111] \rightarrow [y_1 - y_9] = [01d_5d_410110]$$

$$SJ = d_7(d_6\overline{d_5} + \overline{d_6}d_5d_4) \quad (22)$$

$$S = SJ \cdot \text{LEFT} \quad (23)$$
$$[d_7 - d_0] = [1\overline{d_5}d_5d_4000d_0] \rightarrow [y_1 - y_9] = [10d_5\overline{d_4}1d_0\overline{d_0}00]$$

$$J = SJ \cdot \text{RIGHT} \quad (24)$$
$$[d_7 - d_0] = [1\overline{d_5}d_5d_4111d_0] \rightarrow [y_1 - y_9] = [10d_5\overline{d_4}1d_0011]$$

$$QW = \overline{d_3}(\overline{d_2}d_1 + d_2\overline{d_1}d_0) \quad (25)$$

$$Q = QW \cdot \text{TOP} \quad (26)$$
$$[d_7 - d_0] = [111d_40d_2\overline{d_2}d_0] \rightarrow [y_1 - y_9] = [110d_41d_0d_210]$$

$$W = QW \cdot \text{BOTTOM} \quad (27)$$
$$[d_7 - d_0] = [000d_40d_2\overline{d_2}d_0] \rightarrow [y_1 - y_9] = [00d_4\overline{d_4}1d_0d_210]$$

$$T2F = \overline{d_3}d_2(d_1 + d_0) \quad (28)$$

$$T2 = T2F \cdot \text{TOP} \quad (29)$$
$$[d_7 - d_0] = [111d_401d_1d_0] \rightarrow [y_1 - y_9] = [10\overline{d_1d_0}1\overline{d_4}d_410]$$

$$F = T2F \cdot \text{BOTTOM} \quad (30)$$
$$[d_7 - d_0] = [000d_401d_1d_0] \rightarrow [y_1 - y_9] = [00010d_4d_0d_10]$$

$$M2L2 = d_3\overline{d_2d_1d_0} \quad (31)$$

$$L2 = M2L2 \cdot \text{TOP} \quad (32)$$
$$[d_7 - d_0] = [111d_410d_1d_0] \rightarrow [y_1 - y_9] = [10d_1d_01d_4001]$$

$$M2 = M2L2 \cdot \text{BOTTOM} \quad (33)$$
$$[d_7 - d_0] = [000d_410d_1d_0] \rightarrow [y_1 - y_9] = [01d_1d_01d_4001]$$

$$KP = d_3(d_2\overline{d_1} + \overline{d_2}d_1d_0) \quad (34)$$

$$K = KP \cdot \text{TOP} \quad (35)$$
$$[d_7 - d_0] = [111d_41\overline{d_1}d_1d_0] \rightarrow [y_1 - y_9] = [110d_41\overline{d_0}d_101]$$

$$P = KP \cdot \text{BOTTOM} \quad (36)$$
$$[d_7 - d_0] = [000d_41\overline{d_1}d_1d_0] \rightarrow [y_1 - y_9] = [00\overline{d_4}d_41\overline{d_0}d_101]$$

Output odd codeword bits:

$$y_1 = \text{CENTER} \cdot d_7 + R + I + T1 + T2 + L1 + L2 + S + J + Q + K \quad (37)$$

$$y_2 = \text{CENTER} \cdot d_6 + R + I + d_5 \cdot E + \\ M1 + M2 + Z1 + Z2 + Z3 + U + N + Q + K \quad (38)$$

$$y_3 = \\ \text{CENTER} \cdot d_5 + (V + O + E + W)d_4 + (M1 + Z2)\overline{d_5} + (U + N)d_6 + \\ (Z1 + T1 + L1 + Z3 + S + J)d_5 + T2 \cdot \overline{d_1} + (L2 + M2)d_1 + P \cdot \overline{d_4} \quad (39)$$

$$y_4 = (\text{CENTER} + R + I + U + N + Z1 + T1 + L1 + Z3 + Q + K + P) \cdot \\ d_4 + (V + O + M1 + Z2 + S + J + W) \cdot \overline{d_4} + \\ (E + L2 + M2)d_0 + T2 \cdot \overline{d_0} + F \quad (40)$$

$$y_5 = \overline{\text{CENTER} + E + F} \quad (41)$$

$$y_6 = (\text{CENTER} + V + R + I + O + N + S + J + Q + W)d_0 + \\ (U + P + K)\overline{d_0} + (T2 + F + L2 + M2)d_4 + E + Z1 \quad (42)$$

$$y_7 = (\text{CENTER} + K + P)d_1 + (R + V + S)\overline{d_0} + \\ (U + F)d_0 + T2 \cdot \overline{d_4} + (W + Q)d_2 + M1 + L1 + Z3 \quad (43)$$

$$y_8 = \text{CENTER} \cdot d_2 + F \cdot d_1 + I + \\ O + Z2 + N + Z1 + T1 + Z3 + J + Q + W + T2 \quad (44)$$

$$y_9 = \text{CENTER} \cdot d_3 + I + O + M1 + N + L1 + J + L2 + M2 + K + P \quad (45)$$

Equations for the design of encoders 14 (#1), 16 (#2), and 18 (#3) can be created in the same fashion as those for encoder 12 by using FIGS. 6, 7, and 8 respectively. However, the code partitions in FIGS. 5, 6, 7, and 8 are symmetrical, based on this embodiment of the present invention. Therefore, the implementation of encoders 14, 16, and 18, are simple variations of encoder 12 . FIG. 6 is a mirror image of FIG. 5 along the left side of FIG. 6 and the right side of FIG. 5. FIG. 7 is a mirror image of FIG. 5 along the top of FIG. 7 and the bottom of FIG. 5. FIG. 8 is a mirror image of FIG. 5 along the top side of FIG. 8 after FIG. 8 is rotated 180 degrees around its left side, and on the bottom side of FIG. 5. Therefore to get encoder 14 from encoder 12, in all of the equations for encoder 12, invert input data bits d3, d2, d1, and d0 everywhere they are used. To get encoder 16 from encoder 12, in all of the equations for encoder 12, invert input data bits d7, d6, d5, and d4 everywhere they are used. To get encoder 18 from encoder 12, in all of the equations for encoder 12, invert input data bits d7 through d0 everywhere they are used.

The partitioning according to this embodiment of the present invention has an advantage that simplifies the design of the odd codeword encoder. By careful mapping of partitions, odd codeword mapping can be done in another embodiment without the use of four encoders. The input user data bytes are mapped to output codewords in the way that the user data bytes with d3=0 and end with 0 are mapped to codewords that begin with 0 and end with 0. The user bytes with d3=1 and end with 0 are mapped to codewords that begin with 0 and end with 1, etc. This means that y1=d7 and y9=d3. The only exception to this is the group of codes Z1, Z2, and Z3, which are always mapped into pattern 0xxxxxxx0. This partitioning of codewords allows the reuse of the same encoder for the odd codewords, instead using four different encoders. This embodiment significantly simplifies the encoder, as shown in FIG. 9.

Figure 9:
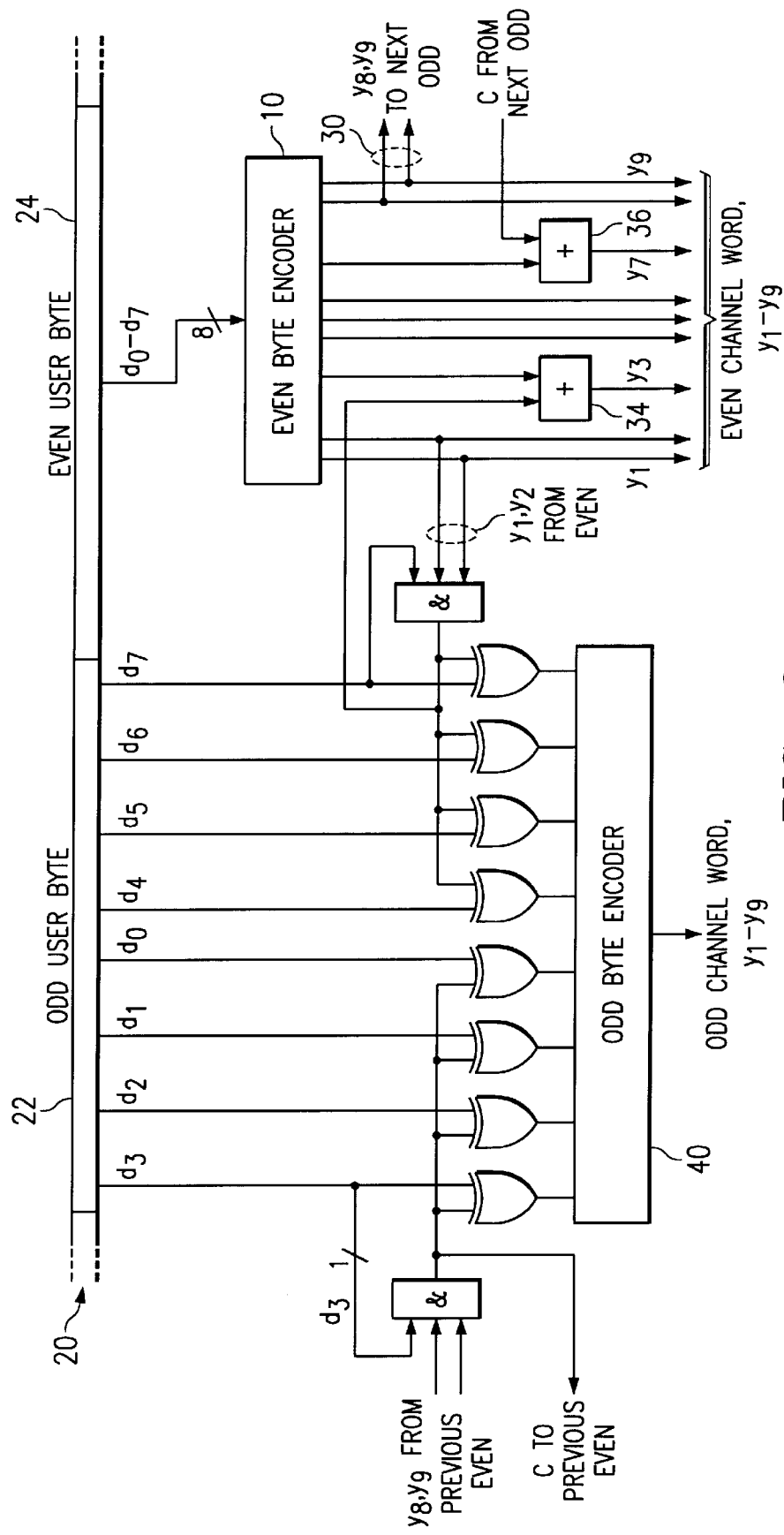
FIG. 9 is an encoder embodiment according to the present invention that uses one odd byte encoder instead of four for the odd codewords.

FIG. 9 shows that the even byte encoder 10 is the same as that for the embodiment shown FIG. 2. However, the one odd byte encoder 40 in FIG. 9 is simpler than having the four shown in FIG. 2. The data is brought to one input of the XOR gate, and control is brought to another. If control (condition satisfied or not) is 0, the XOR gate just passes the data. If control is 1, the XOR gate inverts the data. If an odd user byte starts with 1 and has to be changed to 0, user data bits d3, d2, d1, and d0 are inverted, resulting in a mapping as shown in FIG. 6. If an odd user byte starts with 1, and has to be changed to a 0, user data bits d7, d6, d5, and d4 are inverted, resulting in a mapping as shown in FIG. 7. If both the starting and ending bits have to be changed, user data bits d7 through d0 are inverted, resulting in a mapping as that shown in FIG. 8. Information about the change is stored in bits $y_3$ and $y_7$ of the even codeword.

Figures 12, 14:
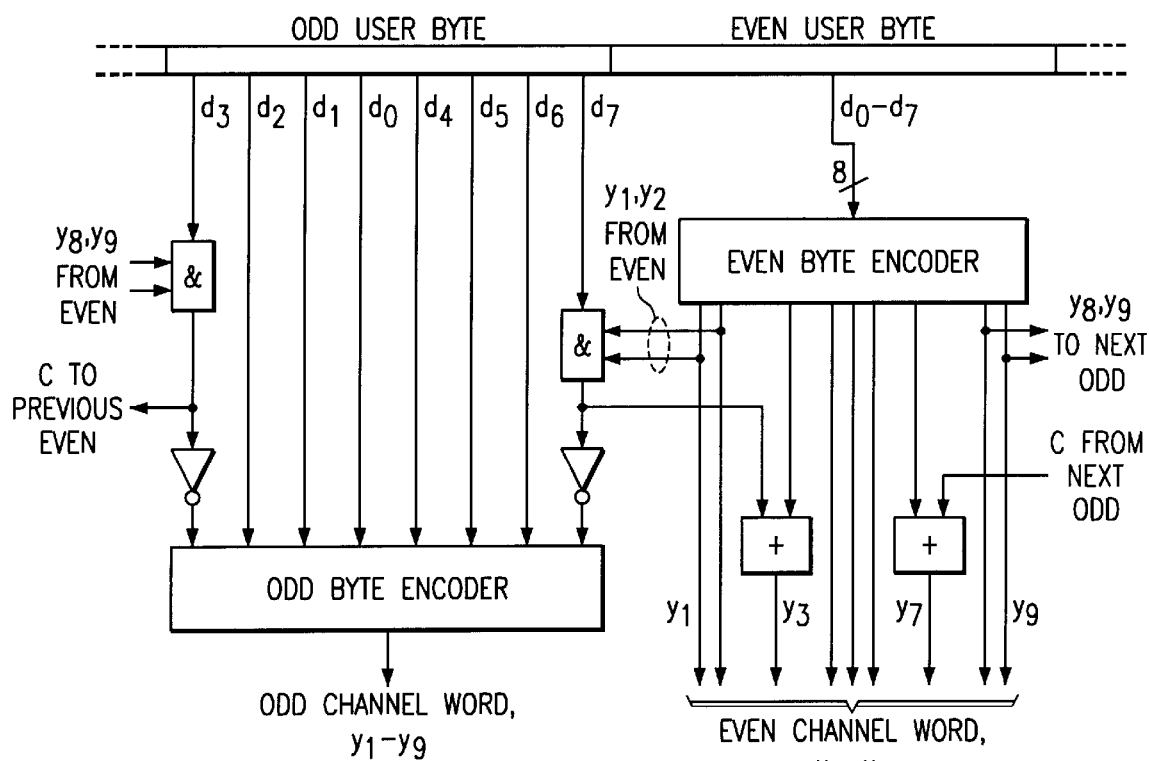
FIG. 12 is a table showing a mapping of the user data bits from even bytes into the even codeword partitions for the even encoder.
FIG. 14 is the preferred encoder embodiment according to the present invention.

The present invention can be implemented in a variety of ways. A designer may have unique criteria that dictate why the present invention is implemented in one way or another, or the designer may just like one way better than another. A simpler embodiment of the present invention that implements the invention is shown in FIG. 14. This is the preferred encoder embodiment of the present invention. If an odd codeword starts or ends with 1, and should start or end with 1, according to rules (IV) and (V), it is converted to 0, using the AND gate and inverter. Information about these changes is stored at bit positions 3 and 7 in the even codeword.

Even Encoder Design Equations

The encoding for the even codewords according to this embodiment of the present invention is implemented by the following Boolean equations. Similar to the equations for the odd codewords, these equations are in terms of the partitioning defined in FIGS. 10 and 11. FIG. 12 shows how the even byte input data bits are mapped to the even codeword partitioning shown in FIGS. 10 and 11. FIG. 12 can be used to help identify which group of input data bits affect which partition of even codewords. The first column and last row of these Figures display the user data bits. The user data bits are labeled as d7, d6, d5, d4, d3, d2, d1, d0, where d7 is the most significant bit (msb) and d0 is the least significant bit (1sb).

Except for the final equations that define the output even codeword bits, the equations are intermediate equations that are used in and help simplify the equations for the output codeword bits. The final equations for the output even codeword bits are used to design the even byte encoder. The Boolean equations for the even codewords are shown following. The mapping of the user data bits to the output codeword bits is shown under some equations.

$$B = \overline{d_7 d_6 d_5 d_4} d_3 d_2 (d_1 + d_0) \quad (46)$$
$[d_7 d_0] = [0 d_6 d_5 d_4 11 d_1 d_0] \rightarrow [y_1 - y_9] = [0 d_6 d_5 d_4 10 \overline{d_0 d_1} 1]$ $$C = d_7 (\overline{d_6} + \overline{d_5 d_4}) d_3 d_2 (d_1 + d_0) \quad (47)$$
$[d_7 d_0] = [1 d_6 d_5 d_4 11 d_1 d_0] \rightarrow [y_1 - y_9] = [1 d_6 d_5 d_4 10 \overline{d_0 d_1} 1]$ $$D = d_7 d_6 (d_5 + d_4) \overline{d_2 d_1 d_0} \quad (48)$$
$[d_7 d_0] = [11 d_5 d_4 d_3 d_2 d_1 d_0] \rightarrow [y_1 - y_9] = [\overline{d_3 d_4 d_5} 01 d_0 d_1 d_2 0]$ $$E = \overline{d_3} d_2 d_1 d_0 \quad (49)$$
$[d_7 d_0] = [d_7 d_6 d_5 d_4 0111] \rightarrow$
$[y_1 - y_9] = [d_7 d_6 \ \overline{d_7 d_6} \ \overline{d_7} d_6 \ 110 d_4 d_5 0]$ $$F = \overline{d_7 d_6 d_5 d_4 d_3 d_2 d_1 d_0} \quad (50)$$
$[d_7 d_0] = [01110 d_2 d_1 d_0] \rightarrow [y_1 y_9] = [011010 d_0 d_1 d_2]$ $$G = \overline{d_7 d_6 d_5 d_4 d_3} \quad (51)$$
$[d_7 d_0] = [01111 d_2 d_1 d_0] \rightarrow [y_1 - y_9] = [0 d_2 d_1 011 d_0 01]$ $$R = R1 + R2 + R3 + R4 \quad (52)$$

| [d7 – d0] | | [y1 – y9] |
|---|---|---|
| 00000000 | R1 | 1011 1 0000 |
| 10000000 | R1 | 1011 1 0100 |
| 00001000 | R1 | 1011 1 0010 |
| 10111011 | R2 | 1011 1 0110 |
| 00110110 | R3 | 1100 1 1101 |
| 01101100 | R3 | 1010 1 1001 |
| 11011111 | R4 | 1010 1 1101 |
| 11101111 | R4 | 1000 1 1001 |
| 11111111 | R4 | 1000 1 1101 |

$$R1 = \overline{d_6 d_5 d_4 d_2 d_1 d_0 (d_7 d_3)} \quad (53)$$
$[d_7 - d_0] = [000 d_4 0000] \rightarrow [y_1 - y_9] = [101110 d_4 00]$ $$R2 = d_7 \overline{d_6} d_5 d_4 d_3 \overline{d_2} d_1 d_0 \quad (54)$$
$[d_7 - d_0] = [10111011] \rightarrow [y_1 - y_9] = [101110110]$ $$R3 = \overline{d_7 d_5 d_3} d_1 (\overline{d_6 d_4 d_2 d_0} + d_6 \overline{d_4 d_2} d_0) \quad (55)$$
$[d_7 - d_0] = [0 d_6 1 \overline{d_6} 0 \overline{d_6} 1 d_6] \rightarrow [y_1 - y_9] = [1 \overline{d_6} d_6 0 1 1 \overline{d_6} 0 1]$ $$R4 = d_7 d_6 d_3 d_2 d_1 d_0 \overline{(d_5 + d_4)} \quad (56)$$
$[d_7 - d_0] = [11 d_5 d_4 1111] \rightarrow [y_1 - y_9] = [10 \overline{d_5} 011 d_4 01]$ $$A = \overline{d_6 d_5 d_4} \cdot \overline{d_2 d_1 d_0} \cdot \overline{d_7 d_6 (d_5 + d_4)} \cdot \overline{d_3 d_2 (d_1 + d_0)} \cdot \overline{R} \quad (57)$$

Output even codeword bits:

$$y_1 = d_7 A + C + D \overline{d_3} + E d_7 d_6 + R \quad (58)$$

$$y_2 = d_6 (A + B + C) + D \overline{d_4} + E d_7 \overline{d_6} + F + G d_2 + R3 d_4 \quad (59)$$

$$y_3 = d_5 (A + B + C) + D \overline{d_5} + \\ E \overline{d_7} d_6 + F + G d_1 + R1 + R2 + R3 d_6 + R4 \overline{d_5} \quad (60)$$

$$y_4 = d_4 (A + B + C) + E + R1 + R2 \quad (61)$$

$$y_5 = \overline{A} \quad (62)$$

$$y_6 = d_0 (A + D + F) + G + R3 + R4 \quad (63)$$

$$y_7 = d_1 A + (B + C) \overline{d_0} + d_1 D + \\ d_4 E + + d_0 G + d_1 F + R1 d_7 + R2 + R3 d_4 + R4 d_4 \quad (64)$$

$$y_8 = d_2 A + (B + C) \overline{d_1} + d_2 D + d_2 F + d_5 E + R1 d_3 + R2 \quad (65)$$

$$y_9 = d_3 A + B + C + G + R3 + R4 \quad (66)$$

Decoder Implementation

The decoder is implemented in the opposite way from the encoder. The detected bits are separated into odd and even groups of bits. Even and odd bytes are decoded in parallel. If the tribit at position 1 in the even codeword is detected, bit 3 in the decoded even byte is changed from 1 to 0 and odd bits are rearranged accordingly. If the tribit at position 7 in the even codeword is detected, bit 7 in the decoded even byte is changed from 1 to 0 and odd bits are rearranged accordingly. The Boolean equations for the even codeword decoding are shown below:

$$B = \overline{y_1} \cdot \overline{y_2 y_3 y_4} \cdot y_5 \overline{y_6 y_7 y_8} y_9 \quad (67)$$

$$C = y_1 (\overline{y_2} + \overline{y_3 y_4}) y_5 \overline{y_6 y_7 y_8} y_9 \quad (68)$$

$$D = \overline{y_2 y_3 y_4} y_5 \overline{y_6 y_7 y_8} y_9 \quad (69)$$

$$E = (\overline{y_1 (y_2 y_3)} + y_1 \overline{y_2 y_3}) y_4 y_5 \overline{y_6} y_9 \quad (70)$$

$$F = \overline{y_1} y_2 y_3 \overline{y_4} y_5 \overline{y_6 y_7 y_8} y_9 \quad (71)$$

$$G = \overline{y_1 y_4} y_5 y_6 \overline{y_8} y_9 \quad (72)$$

$$R1 = y_1 \overline{y_2} y_3 y_4 y_5 \overline{y_6 (y_7 y_8) y_9} \quad (73)$$

$$R2 = y_1 \overline{y_2} y_3 y_4 y_5 \overline{y_6} y_7 y_8 \overline{y_9} \quad (74)$$

$$R3 = y_1 (\overline{y_2} y_3 y_7 + y_2 \overline{y_3} y_7) \overline{y_4} y_5 \overline{y_6 y_8} y_9 \quad (75)$$

$$R4 = y_1 \overline{y_2 y_4} y_5 y_6 \overline{y_8} y_9 (y_3 y_7 + \overline{y_3}) \quad (76)$$

$$A = \overline{y_5 y_2 y_3 y_4} \cdot \overline{y_6 y_7 y_8} \cdot \overline{y_1 y_2 (y_3 + y_4)} \cdot \\ \overline{y_8 y_9 (y_7 + y_6)} \cdot \overline{(R1 + R2 + R3 + R4)} \quad (77)$$

Even codeword decoded bits:

$$d_7 = Ay_1 + C + D + E(y_1 + y_2) + R1y_7 + R2 + R4 \quad (78)$$

$$d_6 = (A + B + C)y_2 + D + E(y_1 + y_3) + F + G + R3y_3 + R4 \quad (79)$$

$$d_5 = (A + B + C)y_3 + D\overline{y_3} + Ey_8 + F + G + R2 + R3 + R4\overline{y_3} \quad (80)$$

$$d_4 = (A + B + C)y_4 + D\overline{y_2} + Ey_7 + F + G + R2 + R3y_2 + R4y_7 \quad (81)$$

$$d_3 = Ay_9 + B + C + D\overline{y_1} + G + R1y_8 + R2 + R4 \quad (82)$$

$$d_2 = Ay_8 + B + C + Dy_8 + E + Fy_8 + Gy_2 + R3y_2 + R4 \quad (83)$$

$$d_1 = (A + F)y_7 + (B + C)\overline{y_8} + Dy_7 + E + Gy_2 + R2 + R3 + R4 \quad (84)$$

$$d_0 = Ay_6 + (B + C)\overline{y_7} + Dy_6 + E + Fy_6 + Gy_7 + R2 + R3y_3 + R4 \quad (85)$$

The Boolean equations for the odd codeword decoding are shown following.

$$E = \overline{y_1}(y_2 + y_3)\overline{y_5}y_6\overline{y_7}y_8\overline{y_9} \quad (86)$$

$$F = \overline{y_1 y_2 y_3}y_4\overline{y_5}(y_7 + y_8)\overline{y_9} \quad (87)$$

$$CENTER = \overline{y_5} \cdot \overline{E} \cdot \overline{F} \quad (88)$$

$$A1 = (y_6 \oplus y_7)\overline{y_8 y_9} \quad (89)$$

$$A2 = \overline{y_6}y_7 y_8\overline{y_9} \quad (90)$$

$$A3 = \overline{y_6 y_7}y_8 y_9 \quad (91)$$

$$A4 = \overline{y_7}y_8 y_9 \quad (92)$$

$$A5 = y_1 y_2\overline{y_3}y_5 \quad (93)$$

$$A6 = y_1\overline{y_2 y_3 y_4}y_5 \quad (94)$$

$$A7 = \overline{y_1}y_2\overline{y_3 y_4}y_5 \quad (95)$$

$$A8 = \overline{y_1 y_2}(y_3 \oplus y_4)y_5 \quad (96)$$

$$R = A1 \cdot A5 \quad (97)$$

$$S = A1 \cdot A6 \quad (98)$$

$$U = A1 \cdot A7 \quad (99)$$

$$V = A1 \cdot A8 \quad (100)$$

$$Q = A2 \cdot A5 \quad (101)$$

$$T = A2 \cdot A6 \quad (102)$$

$$Z = A2 \cdot A7 \quad (103)$$

$$W = A2 \cdot A8 \quad (104)$$

$$K = A3 \cdot A5 \quad (105)$$

$$L = A3 \cdot A6 \quad (106)$$

$$M = A3 \cdot A7 \quad (107)$$

$$P = A3 \cdot A8 \quad (108)$$

-continued $$I = A4 \cdot A5 \quad (109)$$

$$J = A4 \cdot A6 \quad (110)$$

$$N = A4 \cdot A7 \quad (111)$$

$$O = A4 \cdot A8 \quad (112)$$

$$T1 = T \cdot \overline{(y_6 + y_7)}; T2 = T(y_6 + y_7) \quad (113)$$

$$Z2 = Z \cdot \overline{(y_6 + y_7)}; Z3 = Z(\overline{y_6}y_7); Z1 = Z(y_6\overline{y_7}) \quad (114)$$

$$L1 = Ly_7; L2 = L\overline{y_7} \quad (115)$$

$$M1 = My_7; M2 = M\overline{y_7} \quad (116)$$

Odd codeword decoded bits:

$$d_7 = CENTER \cdot y_1 + R + I + Z1 + Z3 + T + L + S + J + Q + K \quad (117)$$

$$d_6 = CENTER \cdot y_2 + R + I + E + M1 + \quad (118)$$
$$Z2 + (U + N)y_3 + (S + J)\overline{y_3} + Q + T2 + L2 + K$$

$$d_5 = (CENTER + Z1 + T1 + L1 + Z3 + S + J) \cdot y_3 + R + \quad (119)$$
$$I + Ey_2 + (M1 + Z2 + U + N)\overline{y_3} + Q + T2 + L2 + K$$

$$d_4 = (CENTER + R + I + U + N + Z1 + T1 + \quad (120)$$
$$L1 + Z3 + Q + K + P)y_4 + (V + O + E)y_3 +$$
$$(Z2 + S + J + M1 + W)\overline{y_4} + T2\overline{y_7} + (F + L2 + M2)y_6$$

$$d_3 = CENTER \cdot y_9 + I + O + M + Z2 + N + L + Z3 + J + K + P \quad (121)$$

$$d_2 = CENTER \cdot y_8 + (Q + W)y_7 + I + O + \quad (122)$$
$$M1 + Z2 + N + L1 + Z3 + J + T2 + F + (K + P)\overline{y_7}$$

$$d_1 = CENTER \cdot y_7 + F \cdot y_8 + I + O + M1 + Z2 + N + L1 + \quad (123)$$
$$Z3 + J + (Q + W)\overline{y_7} + T2\overline{y_3} + (L2 + M2)y_3 + (K + P)y_7$$

$$d_0 = CENTER \cdot y_6 + \quad (124)$$
$$(V + R + I + O + N + S + J + Q + W)y_6 + (E + L2 + M2)y_4 +$$
$$Z2 + (U + F)y_7 + T1 + Z3 + T2\overline{y_4} + (K + P)\overline{y_6}$$

Figure 13:
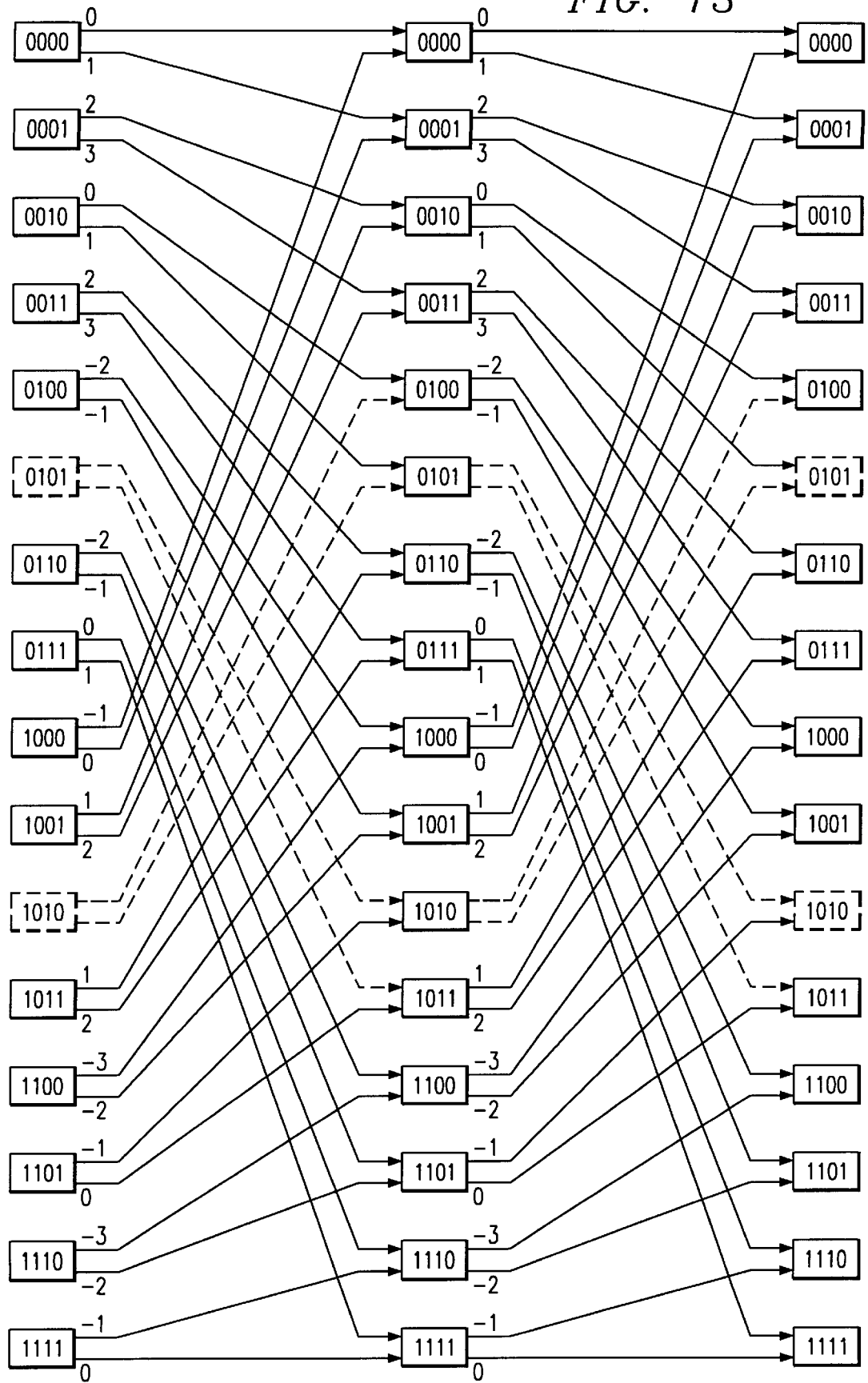
FIG. 13 is a trellis that is invariant in time according to the present invention.

FIG. 13 shows three sequential time intervals of an EEPR4 trellis that is invariant in time according to the present invention. A trellis that varies in time changes its structure in every time instant, i.e., it eliminates different branches or states in every instant. This causes the detector to require switching logic to configure detector circuits for different trellis configurations as you move in time. In the trellis of FIG. 13, the states and the branches do not change if the detector is implemented in the way that it computes the new state in every other time instant. Therefore, as you move in time, the trellis does not change, and thus the detector is less complex. Furthermore, it needs only 14 states for implementation, thus requiring less logic for implementation.

The code described in the present invention keeps any 2-step implementation of the detector time-invariant. The code described in the present invention results in a straight-forward implementation of the Viterbi detector. For example, when applying the code to an E2PR4 trellis, only a 14-state 2-step (radix-4) stationary Viterbi detector is required versus a 16-state time-varying detector as required for the codes introduced in the prior art. The reduced complexity of the detector according to the present invention should increase the detector's speed and power performance.

The application of the code in the present invention is not limited to partial response channels, but can also be applied to other signal processing architectures such as FDTS. It is therefore contemplated that the appended claims will cover any such other signal processing architectures, modifications, or embodiments that fall within the true spirit and scope of the invention.

What is claimed is:

1. A method for encoding an input stream of binary data into an output stream of binary codewords for magnetic recording channels that eliminates the most common error events associated with Partial Response Maximum Likelihood channels, said method comprising:

receiving a plurality of input data bits;

grouping said plurality of input data bits into bytes of eight bits each;

separating said bytes into even bytes and odd bytes, one of said odd bytes comprising the first eight bits received followed by one of said even bytes comprising the next eight bits received, said odd and even bytes alternating thereafter;

encoding each said even bytes into even codewords; and encoding each said odd bytes into odd codewords based on the even codeword for the even byte preceding each said odd bytes and the even codeword for the even byte following each said odd bytes;

wherein the most common error events associated with Partial Response Maximum Likelihood channels are eliminated by: (i) disallowing sequences of four consecutive ones in said even codewords and said odd codewords, (ii) allowing sequences of three consecutive ones to begin only on even bit positions in odd codewords (i.e. $2^{nd}$, $4^{th}$, $6^{th}$, $8^{th}$), or on bit positions 3 and 5 in even codewords, (iii) constructing the even byte encoder in a way that it allows sequences starting with 1100x, but eliminates sequences starting with 1101x, 1110x, and 1111x, and also allows sequences ending with x0011, but eliminates sequences ending with x1011, x0111, and x1111, (iv) insuring that if an even codeword starts with 11x, the previous odd codeword cannot end with xx1 (last bit has to be 0), and if an even codeword ends with x11, the following odd codeword has to start with 0x, therefore allowing sequences of three consecutive ones to begin on bit positions 1 and 7 in even codewords, and (v) insuring that when an even codeword starts with 11x and an odd codeword ends with x1, bit 9 in the odd codeword is changed from 1 to 0, and bit 3 in the even codeword is changed from 0 to 1, and also when an even codeword ends with x11 and an odd codeword starts with 1x, bit 1 of the odd codeword is changed from 1 to 0 and bit 7 in the even codeword is changed from 0 to 1.

2. The method recited in claim 1 further comprising limiting the maximum zero runlength to seven in said even codewords for the even bytes.

3. The method recited in claim 1 further comprising limiting the maximum zero runlength to three in said odd codewords for the odd bytes.

4. The method recited in claim 1 further comprising limiting the maximum total zero runlength to ten.

5. The method recited in claim 1 wherein a partial response trellis based on said odd codewords and said even codewords is invariant in time.

6. The method recited in claim 1 wherein said odd codewords and said even codewords limit the burst error propagation to three user bytes.

7. A method for encoding an input stream of user data bits into binary codewords for magnetic recording channels comprising the steps of:

separating the user data bits into odd bytes and even bytes;

encoding the even bytes into even codewords;

encoding the odd bytes into odd codewords based on the encoding of the preceding even byte and the encoding of the following even byte;

disallowing sequences of four consecutive ones in said even codewords and said odd codewords;

allowing sequences of three consecutive transitions to begin only on even bit positions in said odd codewords;

allowing sequences of three consecutive transitions to begin only on bit positions 3 and 5 in said even codewords;

allowing sequences starting with 1100x in the even codewords;

eliminating sequences starting with 1101x, 1110x, and 1111x in the even codewords;

allowing sequences ending with x0011 in the even codewords;

eliminating sequences ending with x1011, x0111, and x1111 in the even codewords;

insuring that if the even codeword starts with 11x, the previous odd codeword cannot end with xx1;

insuring that if the even codeword ends with x11, the following odd codeword has to start with 0x, therefore allowing sequences of three consecutive ones to begin on bit positions 1 and 7 in the even codewords;

changing bit 9 of said odd codeword from 1 to 0, and bit 3 in a subsequent said even codeword from 0 to 1 when the even codeword starts with 11x and the odd codeword ends with x1; and changing bit 1 of said odd codeword from 1 to 0 and bit 7 in a preceding said even codeword from 0 to 1 when the even codeword ends with x11 and the odd codeword starts with 1x.

8. The method recited in claim 7 further comprising limiting the maximum zero runlength to seven in said even codewords for the even bytes.

9. The method recited in claim 7 further comprising limiting the maximum zero runlength to three in said odd codewords for the odd bytes.

10. The method recited in claim 7 further comprising limiting the maximum total zero runlength to ten.

11. The method recited in claim 7 wherein a code trellis based on said odd codewords and said even codewords is invariant in time.

12. The method recited in claim 7 wherein said odd codewords and said even codewords limit the burst error propagation to three user bytes.

13. A method for encoder design, said encoder encoding user data bits to codewords for magnetic recording, said method allowing for easy modification of encoder design to conform with changes required due to the remapping of codewords, said method comprising the steps of:

developing rules for allowed odd codewords encoded from odd user data bytes;

developing rules for allowed even codewords from encoded even user data bytes;

grouping said allowed odd codewords into partitions based on the symmetry between the odd codewords;

grouping said allowed even codewords into partitions based on the symmetry between the even codewords;

creating Boolean equations for the design of the encoder, said equations based on said partitions of said even codewords and said odd codewords; and designing the encoder based on said Boolean equations;

wherein said encoder design is easily modified to conform with changes required due to the remapping of codewords in certain said partitions.

14. An encoding system comprising:

an even byte encoder that encodes even bytes of user data into even codewords;

a controller, said controller receiving control information from said even byte encoder;

one or more odd byte encoders that encode odd bytes of user data into odd codewords; and a selector operatively connected to said controller, said selector selecting one of said odd codewords from the output of one of said one or more odd encoders;

wherein each said even bytes of user data is encoded first, and the encoding of each said odd bytes of user data is based on the encoding of the preceding even byte of user data and the encoding of the following even byte of user data.

* * * * *